United States Patent
Nakazumi et al.

(10) Patent No.: US 9,536,912 B2
(45) Date of Patent: Jan. 3, 2017

(54) METHOD OF TRANSFERRING THIN FILM, METHOD OF MANUFACTURING THIN FILM TRANSISTOR, METHOD OF FORMING PIXEL ELECTRODE OF LIQUID CRYSTAL DISPLAY DEVICE

(71) Applicant: NIKON CORPORATION, Tokyo (JP)

(72) Inventors: Makoto Nakazumi, Yamato (JP); Yasutaka Nishi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 21 days.

(21) Appl. No.: 14/798,964

(22) Filed: Jul. 14, 2015

(65) Prior Publication Data
US 2015/0318306 A1 Nov. 5, 2015

Related U.S. Application Data

(63) Continuation of application No. PCT/JP2014/053043, filed on Feb. 10, 2014.

(30) Foreign Application Priority Data
Feb. 15, 2013 (JP) .................. 2013-027594

(51) Int. Cl.
*H01L 21/30* (2006.01)
*H01L 27/12* (2006.01)
*G02F 1/1368* (2006.01)
*H01L 21/20* (2006.01)
*H01L 29/786* (2006.01)
*G02F 1/136* (2006.01)

(52) U.S. Cl.
CPC .......... *H01L 27/127* (2013.01); *G02F 1/1368* (2013.01); *H01L 21/2007* (2013.01); *H01L 27/124* (2013.01); *H01L 27/1225* (2013.01); *H01L 27/1266* (2013.01); *H01L 29/7869* (2013.01); *G02F 2001/13613* (2013.01)

(58) Field of Classification Search
None
See application file for complete search history.

(56) References Cited

U.S. PATENT DOCUMENTS

2015/0318306 A1* 11/2015 Nakazumi .......... H01L 29/7869
438/104

FOREIGN PATENT DOCUMENTS

JP 8-160424 6/1996

OTHER PUBLICATIONS

PCT International Search Report dated Apr. 8, 2014 in corresponding International Patent Application No. PCT/JP2014/053043.
PCT Written Opinion of the International Searching Authority dated Apr. 8, 2014 in corresponding International Patent Application No. PCT/JP2014/053043.

* cited by examiner

*Primary Examiner* — Jack Chen

(57) ABSTRACT

A method of transferring a thin film is a method of transferring a thin film formed on a first substrate to a second substrate, the method including: allowing the first substrate to come into contact with a liquid to swell the first substrate; allowing the second substrate and the thin film to come into contact with each other via the liquid; and drying the liquid to allow the thin film to adhere to the second substrate.

11 Claims, 8 Drawing Sheets

(a)

(b)

(c)

(d)

METHOD OF TRANSFERRING THIN FILM, METHOD OF MANUFACTURING THIN FILM TRANSISTOR, METHOD OF FORMING PIXEL ELECTRODE OF LIQUID CRYSTAL DISPLAY DEVICE

CROSS-REFERENCE TO RELATED APPLICATION

This is a Continuation Application of International Application No. PCT/JP2014/53043 filed on Feb. 10, 2014, which claims priority on Japanese Patent Application No. 2013-27594 filed on Feb. 15, 2013, the contents of which are incorporated herein by reference.

BACKGROUND

Field of the Invention

The present invention relates to a method of transferring a thin film, a method of manufacturing a thin film transistor, a method of forming a pixel electrode of a liquid crystal display device.

Background

An oxide semiconductor film is a material having both visible light transparency and electrical conductivity, and therefore has been used as a transparent electrode of a flat panel display (FPD), a thin film solar cell, or the like.

On the other hand, an oxide semiconductor film has semiconductor properties and therefore is used also as a semiconductor layer of a thin film transistor. The oxide semiconductor film is generally deposited by a vacuum deposition method such as a sputtering method. Since the vacuum deposition method requires a large-scale vacuum apparatus, the manufacturing cost increases.

As a further simple deposition method of the oxide semiconductor film, wet deposition methods such as a sol-gel method, an electroless deposition method, and an electrolytic deposition method are known. However, although in the deposition methods, growth (deposition) is performed at high temperatures by heating a substrate or the like, and thereby an oxide semiconductor film having a high crystalline quality can be obtained, it is difficult to obtain an oxide semiconductor film having a high crystalline quality at low temperatures (about 100 to 200° C.) which a resin substrate represented by polyethylene terephthalate (PET) or the like is able to withstand.

Examples of a method of obtaining an oxide semiconductor film having a high crystalline quality such as one obtained by a vacuum deposition method at low temperatures and at normal pressures include a transfer method. For example, Japanese Patent Application, Publication No. H8-160424 discloses a technique of using a transfer foil obtained by sequentially forming at least a transparent conductive layer and an adhesion layer directly or via a release layer on a plastic film and transferring the transparent conductive layer to a substrate.

SUMMARY

However, there is a problem that, when a release layer or an adhesion layer is used at the time of performing transferring of a thin film as disclosed in the related art, the cost increases for the layer. Further, there is a case in which the release layer and the adhesion layer may cause a problem in terms of design when fabricating an electronic device using a thin film.

An object of an aspect of the present invention is to provide a method of transferring a thin film, a method of manufacturing a thin film transistor, a method of forming a pixel electrode of a liquid crystal display device capable of transferring a thin film on a substrate without using a release layer or an adhesion layer.

An aspect of the present invention is a method of transferring a thin film, in which a thin film formed on a first substrate is transferred to a second substrate, the method including: allowing the first substrate to come into contact with a liquid to swell the first substrate; allowing the second substrate and the thin film to come into contact with each other via the liquid; and drying the liquid to allow the thin film to adhere to the second substrate.

Further, another aspect of the present invention is a method of manufacturing a thin film transistor, the method including: forming a semiconductor layer provided in contact with a source electrode and a drain electrode, wherein the semiconductor layer is formed by the method of transferring a thin film of the above aspect.

Further, another aspect of the present invention is a method of forming a pixel electrode of a liquid crystal display device, the method including: forming a pixel electrode connected to a thin film transistor, wherein the pixel electrode is formed by the method of transferring a thin film of the above aspect.

According to an aspect of the present invention, it is possible to transfer a thin film on a substrate without using a release agent or an adhesion layer.

DESCRIPTION OF THE EMBODIMENTS

Hereinafter, with reference to the drawings, a method of transferring a thin film, a method of manufacturing a thin film transistor, a method of forming a pixel electrode of a liquid crystal display device according to the present embodiment will be described.

Note that, in the following drawings, the dimensions, ratios, and the like of each constituent element are varied for ease of understanding.

In addition, the present embodiment is intended to explain the scope of the invention in detail so that it can be better understood, and does not limit the present invention unless otherwise specified.

[Method of Transferring a Thin Film]

First Example

Figure 1:
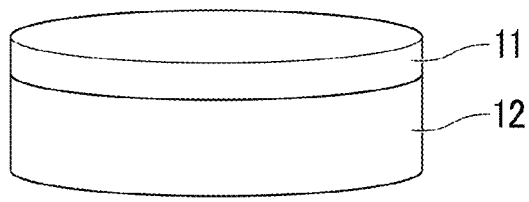
FIG. 1 is a process diagram showing a first example of a method of transferring a thin film.
Figure 1:
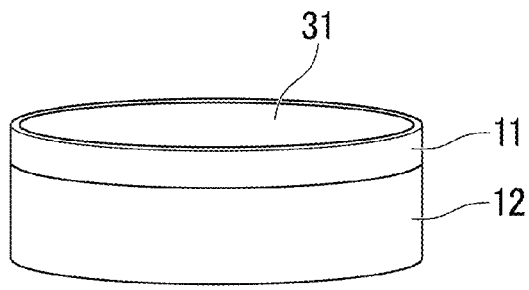
Figure 1:
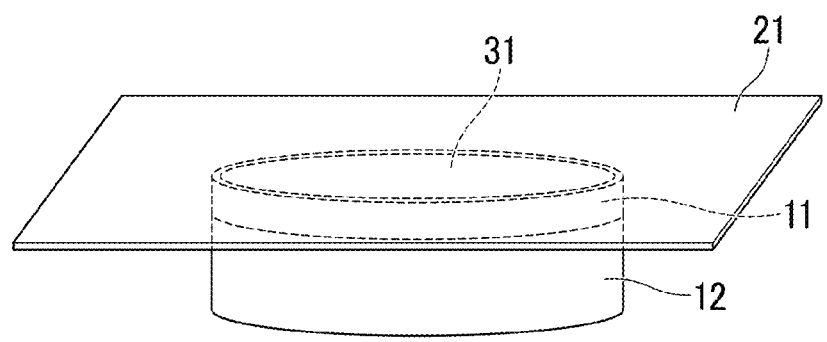
Figure 1:
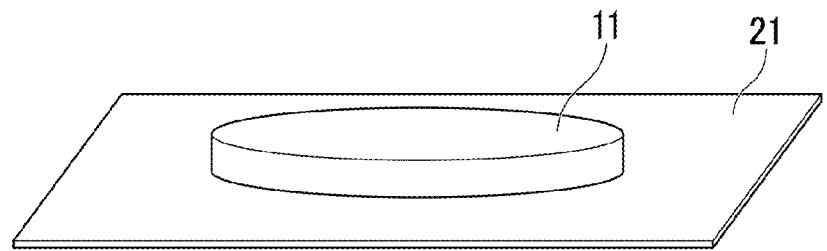

FIG. 1 is a process diagram showing a first example of a method of transferring a thin film according to the present embodiment.

First, as shown in FIG. 1 (a), a first substrate 12 on which a thin film 11 is deposited is prepared.

Vacuum deposition methods such as a sputtering method, an evaporation method, and a CVD method are used for forming the thin film 11 on the first substrate 12.

In general, impurities in a thin film deposited by the above-described vacuum deposition methods are less than impurities in a thin film deposited by wet deposition methods such as a sol-gel method, an electroless deposition method, and an electrolytic deposition method. Further, when using plasma or the like, since it is possible to deposit high-energy particles, the thin film deposited by the vacuum deposition methods tends to be a film having a high crystalline quality and tends to be excellent in electrical conductivity and transmissivity.

The thin film 11 is not particularly limited; for example, an oxide semiconductor film is used. Examples of a material constituting such an oxide semiconductor film include zinc oxide (ZnO), indium tin oxide (ITO), and the like. When zinc oxide is used, an aluminum-doped zinc oxide (AZO) film to which conductivity is imparted by slightly doping zinc oxide with aluminum (for example, about 1 to 5 atom %) may be formed. Alternatively, conductivity may be imparted by doping zinc oxide with gallium or the like as a material other than aluminum.

The thickness of the thin film 11 is not particularly limited as long as liquid (described later) is capable of penetrating the thin film 11 to arrive at the first substrate 12; the thickness of the thin film 11 can be, for example, 50 nm to 2 µm. For example, the thickness of the thin film 11 can be about 50 nm, 60 nm, 70 nm, 80 nm, 90 nm, 100 nm, 200 nm, 300 nm, 400 nm, 500 nm, 600 nm, 700 nm, 800 nm, 900 nm, 1000 nm, or 2000 nm.

The bulk density of the thin film 11 is not particularly limited as long as liquid (described later) is capable of penetrating the thin film 11 to arrive at the first substrate 12; the bulk density of the thin film 11 can be, for example, 2.0 $kg/m^3$ to 5.6 $kg/m^3$. For example, the bulk density of the thin film 11 can be about 2.0 $kg/m^3$, 2.5 $kg/m^3$, 3.0 $kg/m^3$, 3.5 $kg/m^3$, 4.0 $kg/m^3$, 4.5 $kg/m^3$, 5.0 $kg/m^3$, 5.5 $kg/m^3$, or 5.6 $kg/m^3$.

Note that, the thickness of the thin film 11 and the bulk density of the thin film 11 are adjustable easily by controlling deposition conditions such as a deposition time, degree of vacuum, a voltage applied to a target, and a distance between the target and a substrate when deposition is performed by a vacuum deposition method.

As the first substrate 12, a substrate that has lower wettability for liquid (described later) than the second substrate (described later) and that swells easily by the liquid (described later) is used. Examples of such a first substrate 12 include an acrylic substrate, a polystyrene substrate, and the like.

Note that, "wettability" refers to a characteristic which is determined, when liquid is dropped to a substrate, by an angle (contact angle) formed by a droplet and a substrate surface. When the contact angle is large, it is expressed that the wettability is low (difficult to wet). When the contact angle is small, it is expressed that the wettability is high (easy to wet).

Note that, the first substrate 12 that has been swelled by liquid can be used again for formation and peeling of the thin film 11 after drying the substrate.

Next, a second substrate 21 to which the thin film 11 is transferred is prepared (refer to FIG. 1 (c)).

The second substrate 21 is not particularly limited as long as the second substrate 21 has higher wettability for liquid (described later) than the first substrate 12 described above. Examples of such a second substrate 21 include a resin substrate such as polyethylene terephthalate (PET), a glass substrate such as $SiO_2$, and the like.

In order to improve wettability for liquid (described later), ultraviolet cleaning, plasma treatment, or the like may be applied on a surface, to which the thin film 11 is transferred, of the second substrate 21.

Next, as shown in FIG. 1 (b), liquid 31 is applied to the thin film 11 formed on the first substrate 12.

As the method of applying the liquid 31 to the thin film 11, a dip coating method of immersing the whole first substrate 12 on which the thin film 11 is formed in the liquid 31, a dropping method of dropping the liquid 31 on the thin film 11, a spray coating method of spraying the liquid 31 on the thin film 11, or the like is used.

The amount of the liquid 31 applied to the thin film 11 is not particularly limited as long as the amount of the liquid 31 is such a sufficient amount that the liquid 31 can be applied to the whole thin film 11 formed on the first substrate 12. The amount of the liquid 31 applied to the thin film 11 is appropriately adjusted in accordance with the thickness of the thin film 11, the bulk density of the thin film 11, or the like. Further, the amount of the liquid 31 applied to the thin film 11 is made to be a sufficient amount such that, when a surface on which the thin film 11 is formed in the first substrate 12 is made to come into contact with the second substrate 21, the liquid 31 in a state after the liquid 31 is applied to the thin film 11 can be interposed between the second substrate 21 and the thin film 11 formed on the first substrate 12.

As the liquid 31, a liquid that can swell the first substrate 12 can be used, and water, alcohol, or a mixture of water and alcohol is used. Examples of alcohol include methanol, ethanol, isopropyl alcohol, 1-propanol, and the like.

Next, as shown in FIG. 1 (c), the liquid 31 is applied to the thin film 11 formed on the first substrate 12, and in a state where the thin film 11 is sufficiently wet with the liquid 31, the surface on which the thin film 11 is formed in the first substrate 12 is made to come into contact with the second substrate 21. Accordingly, the liquid 31 penetrates the thin film 11 to arrive at the first substrate 12, and the first substrate 12 swells due to the liquid 31. Thereby, the thin film 11 is peeled from the first substrate 12, and the peeled thin film 11 adheres to the second substrate 21. It is considered that the reason why the peeled thin film 11 adheres to the second substrate 21 in this way is that the wettability of the second substrate 21 for the liquid 31 is higher than the wettability of the first substrate 12 for the liquid 31 and that the thin film 11 is attracted to the second substrate 21 due to the surface tension of the liquid 31.

Next, the first substrate 12 and the second substrate 21 are heated. Accordingly, the liquid 31 evaporates, the thin film 11, the first substrate 12, and the second substrate 21 are dried, and, as shown in FIG. 1 (d), the thin film 11 is transferred (adheres) firmly to the second substrate 21. Note that, in the present embodiment, heating of the first substrate 12 and the second substrate 21 is performed such that the liquid 31 is dried. Therefore, when the liquid 31 can be dried at room temperature, it is not necessary to perform heating of the first substrate 12 and the second substrate 21. However, from the viewpoint of shortening the transfer time of the thin film 11, it is possible to perform heating of the first substrate 12 and the second substrate 21 and to allow the liquid 31 to be easily dried.

Note that, after applying the liquid 31 to the thin film 11 formed on the first substrate 12 and before the liquid 31 is dried, the surface on which the thin film 11 is formed in the first substrate 12 can be made to come into contact with the second substrate 21.

Further, when the thin film 11 peeled from the first substrate 12 is made to attach to the second substrate 21, the thin film 11 can be made to come into contact with the second substrate 21 while keeping a state where the thin film 11 is sufficiently wet with the liquid 31.

When the amount of the liquid 31 is insufficient, the thin film 11 peeled from the first substrate 12 tends to be difficult to adhere to the second substrate 21.

Further, when causing the thin film 11 peeled from the first substrate 12 to adhere to the second substrate 21, the temperature of heating the second substrate 21 may be equal to or greater than a temperature at which the liquid 31 evaporates (boiling point of liquid) and less than a melting point of the first substrate 12 and the second substrate 21. For example, when an acrylic substrate is used as the first substrate 12, a PET substrate is used as the second substrate 21, and ethanol is used as the liquid 31, the temperature of heating the first substrate 12 and the second substrate 21 can be about 100° C.).

Second Example

Figure 2:
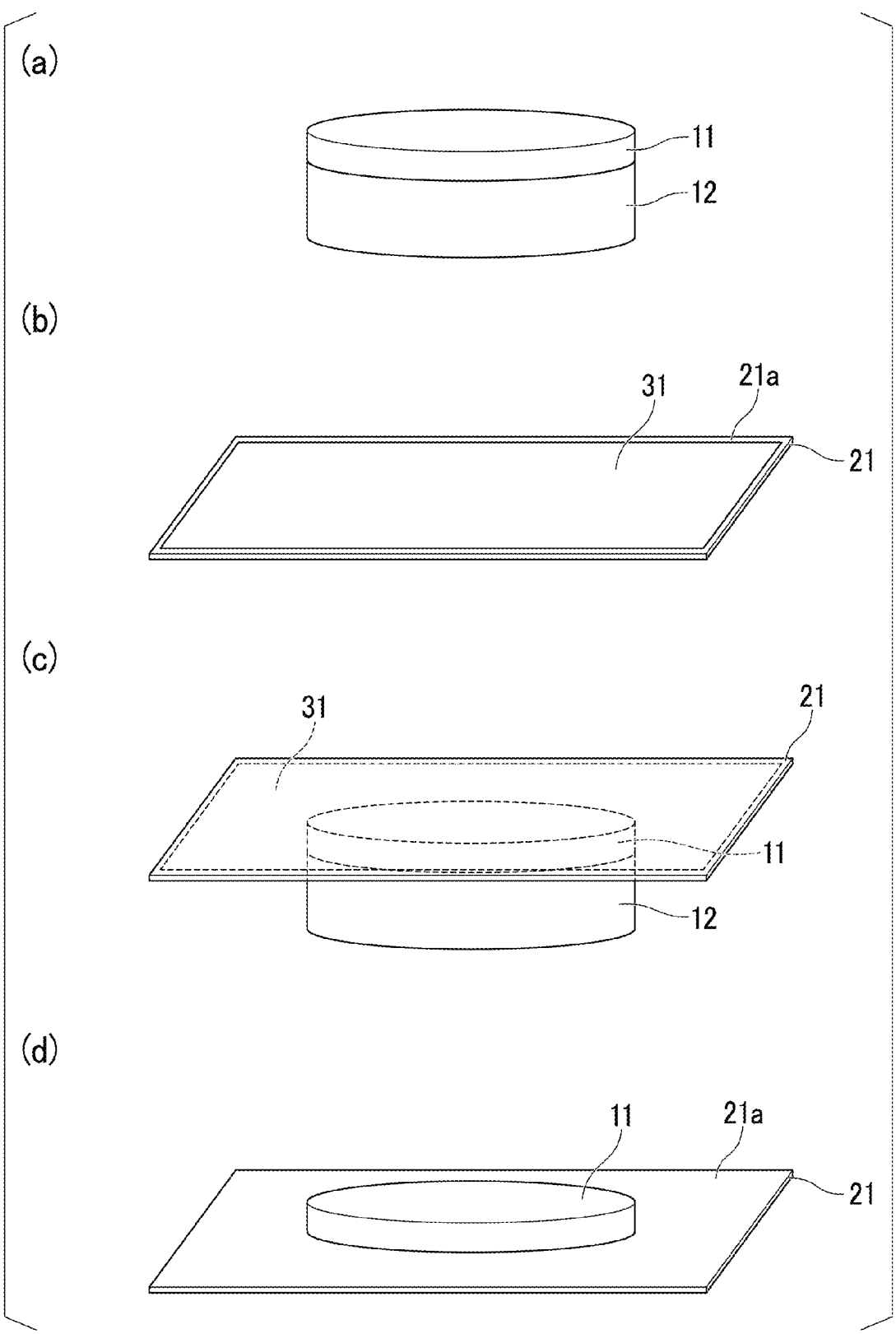
FIG. 2 is a process diagram showing a second example of the method of transferring a thin film.

FIG. 2 is a process diagram showing a second example of the method of transferring a thin film according to the present embodiment. In FIG. 2, the same constituents as those of the first example of the method of transferring a thin film shown in FIG. 1 are denoted with the same reference numerals, and the description of the constituents is omitted.

First, as shown in FIG. 2 (a), a first substrate 12 on which a thin film 11 is deposited is prepared.

Next, a second substrate 21 to which the thin film 11 is transferred is prepared (refer to FIG. 1 (b)).

Next, as shown in FIG. 1 (b), liquid 31 is applied to a surface (surface to be made to come into contact the surface on which the thin film 11 is formed in the first substrate 12) 21a of the second substrate 21.

As the method of applying the liquid 31 to the surface 21a of the second substrate 21, a dip coating method of immersing the second substrate 21 in the liquid 31, a dropping method of dropping the liquid 31 on the surface 21a of the second substrate 21, a spray coating method of spraying the liquid 31 on the surface 21a of the second substrate 21, or the like is used.

The amount of the liquid 31 applied to the surface 21a of the second substrate 21 is not particularly limited as long as the amount of the liquid 31 is such a sufficient amount that the liquid 31 can be applied to the whole thin film 11 formed on the first substrate 12 when the surface on which the thin film 11 is formed in the first substrate 12 is made to come into contact with the second substrate 21. The amount of the liquid 31 applied to the surface 21a of the second substrate 21 is appropriately adjusted in accordance with the thickness of the thin film 11, the bulk density of the thin film 11, or the like. Further, the amount of the liquid 31 applied to the surface 21a of the second substrate 21 is made to be a sufficient amount such that, when a surface on which the thin film 11 is formed in the first substrate 12 is made to come into contact with the second substrate 21, the liquid 31 in a state after the liquid 31 is applied to the surface 21a of the second substrate 21 can be interposed between the second substrate 21 and the thin film 11 formed on the first substrate 12.

Next, as shown in FIG. 2 (c), the surface 21a of the second substrate 21 on which the liquid 31 is applied is made to come into contact with the surface on which the thin film 11 is formed in the first substrate 12. That is, the surface on which the thin film 11 is formed in the first substrate 12 is made to come into contact via the liquid 31 with the surface 21a of the second substrate 21 on which the liquid 31 is applied. Accordingly, the liquid 31 penetrates the thin film 11 to arrive at the first substrate 12, and the first substrate 12 is swelled by the liquid 31. Thereby, the thin film 11 is peeled from the first substrate 12, and the peeled thin film 11 adheres to the second substrate 21. It is considered that the reason why the peeled thin film 11 adheres to the second substrate 21 in this way is that the wettability of the second substrate 21 for the liquid 31 is higher than the wettability of the first substrate 12 for the liquid 31 and that the thin film 11 is attracted to the second substrate 21 due to the surface tension of the liquid 31.

Next, the first substrate 12 and the second substrate 21 are heated. Accordingly, the liquid 31 evaporates, the thin film 11, the first substrate 12, and the second substrate 21 are dried, and, as shown in FIG. 2 (d), the thin film 11 is transferred (adheres) firmly to the surface 21a of the second substrate 21. Note that, in the present embodiment, heating of the first substrate 12 and the second substrate 21 is performed such that the liquid 31 is dried. Therefore, when the liquid 31 can be dried at room temperature, it is not necessary to perform heating of the first substrate 12 and the second substrate 21. However, from the viewpoint of shortening the transfer time of the thin film 11, it is possible to perform heating of the first substrate 12 and the second substrate 21 and to allow the liquid 31 to be easily dried.

According to the method of transferring a thin film of the present embodiment, it is not necessary to provide a release film in the related art that is intended to facilitate peeling a thin film from the substrate, and therefore it is possible to prevent contamination that derives from the release film to adhere to the thin film 11. Further, since not only it is not necessary to transfer the thin film 11 on the second substrate 21 via an adhesive but the thin film 11 can be transferred as it is also on a metal wiring or an electronic device, the method is applicable to a wider range of applications than conventional transfer methods. Therefore, when the thin film 11 to be transferred on the second substrate 21 is formed by an oxide semiconductor or the like showing a high mobility according to the method of transferring a thin film of the present embodiment, it is also possible to use the thin film 11 as a channel layer of a thin film transistor. On the other hand, when patterning the thin film 11 formed on the first substrate 12 before transferring the thin film 11 and then transferring the thin film 11 on the second substrate 21, it is possible to transfer the patterned thin film 11 on the second substrate 21 as it is, and therefore it is possible to easily transfer the patterned thin film 11 without using a resist or the like. Note that, the method of transferring a thin film of the present embodiment can be used for a second substrate having flexibility and is also applicable to, for example, a roll-to-roll method of continuously performing deposition on a substrate at low temperatures and at normal pressures.

[Method of Manufacturing a Thin Film Transistor]

A method of manufacturing a thin film transistor of the present embodiment is a method including a process of forming an oxide semiconductor layer by the above-described method of transferring a thin film.

Figure 3:
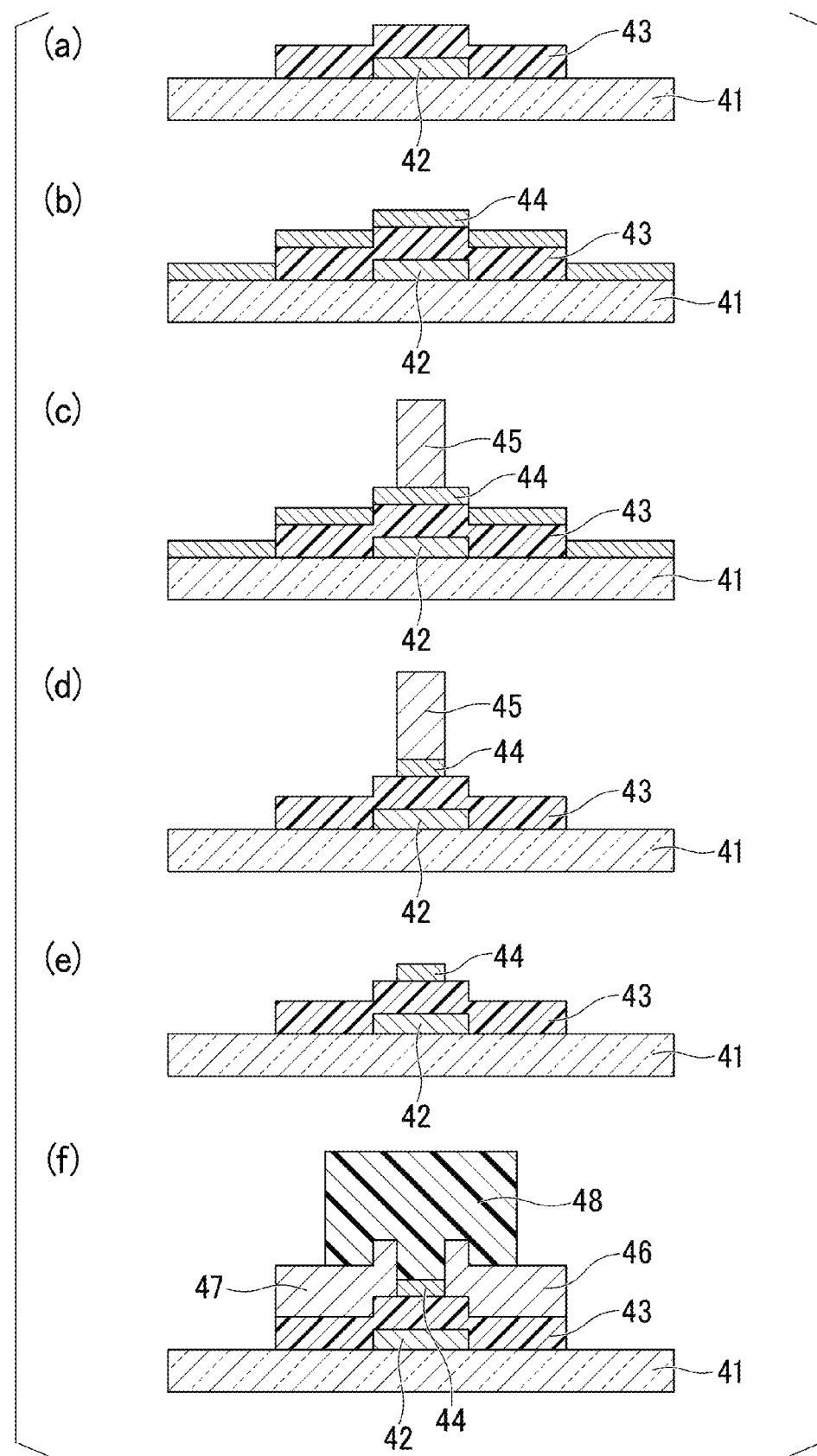
FIG. 3 is a process diagram showing an example of a method of manufacturing a thin film transistor.

FIG. 3 is a process diagram showing an example of the method of manufacturing a thin film transistor according to the present embodiment.

(1) First, as shown in FIG. 3 (a), with a known technique, a gate electrode 42 and a gate insulating film 43 are formed on a substrate (hereinafter, referred to as a "second substrate") 41 made of resin, glass, or the like.

(2) Next, as shown in FIG. 3 (b), an oxide semiconductor film 44 is transferred on a second substrate 41, on which the gate electrode 42 and the gate insulating film 43 are formed, according to the above-described method of transferring a thin film of the present embodiment.

At this time, a substrate (hereinafter, referred to as a "first substrate"), on which the oxide semiconductor film 44 having a predetermined desired thickness is formed, is prepared. Note that, the thickness of the oxide semiconductor film 44 is not particularly limited; the thickness of the oxide semiconductor film 44 can be, for example, in a range of 100 nm to 1 μm. For example, the thickness of the oxide semiconductor film 44 can be about 100 nm, 200 nm, 300 nm, 400 nm, 500 nm, 600 nm, 700 nm, 800 nm, 900 nm, or 1000 nm.

Further, after liquid is applied to the oxide semiconductor film 44 formed on the first substrate or liquid is applied to the second substrate 41 on which the gate electrode 42 and the gate insulating film 43 are formed, a surface on which the oxide semiconductor film 44 is formed in the first substrate and a surface on which the gate electrode 42 and the gate insulating film 43 are formed in the second substrate 41 are made to come into contact with each other via liquid, and the first substrate and the second substrate 41 are heated.

(3) Next, as shown in FIG. 3 (c), a resist 45 is applied on the oxide semiconductor film 44 transferred on the second substrate 41, the resist 45 is exposed and developed, and the oxide semiconductor film 44 is patterned into a desired shape.

(4) Next, as shown in FIG. 3 (d), since chemical durability of the oxide semiconductor film 44 transferred on the second substrate 41 is completely the same as chemical durability of the oxide semiconductor film 44 before the oxide semiconductor film 44 is transferred, the oxide semiconductor film 44 is etched using a commonly-used etcher.

(5) Next, as shown in FIG. 3 (e), the resist 45 is removed.

(6) Next, as shown in FIG. 3 (f), a source electrode 46, a drain electrode 47, and a passivation film 48 are formed to obtain a thin film transistor.

According to the method of manufacturing a thin film transistor of the present embodiment, when the oxide semiconductor film 44 is transferred from the first substrate to the second substrate 41, a release film or an adhesive is not required, and therefore it is possible to directly form the oxide semiconductor film 44 on the second substrate 41 to be a ground. Further, since the gate electrode 42 and the gate insulating film 43 are insoluble in liquid required when the oxide semiconductor film 44 is peeled from the first substrate, the gate electrode 42 and the gate insulating film 43 are not degraded due to the liquid. Further, since the temperature when the oxide semiconductor film 44 is transferred is equal to or greater than a temperature at which the liquid evaporates (boiling point of liquid) and is less than a melting point of the first substrate and the second substrate 41, the gate electrode 42 and the gate insulating film 43 are not degraded due to heat when the oxide semiconductor film 44 is transferred.

Note that, in the example described above, a method has been described in which the oxide semiconductor film 44 is formed on the gate insulating film 43 and then the source electrode 46 and the drain electrode 47 are formed. However, after the source electrode 46 and the drain electrode 47 are formed on the gate insulating film 43, the oxide semiconductor film 44 may be formed (transferred). Then, if necessary, the oxide semiconductor film 44 is patterned into a desired shape, and thereby it is possible to form a thin film transistor having the same performance as the example described above.

Further, in addition to the example described above, a thin film transistor can be manufactured in the following manner.

Figure 4:
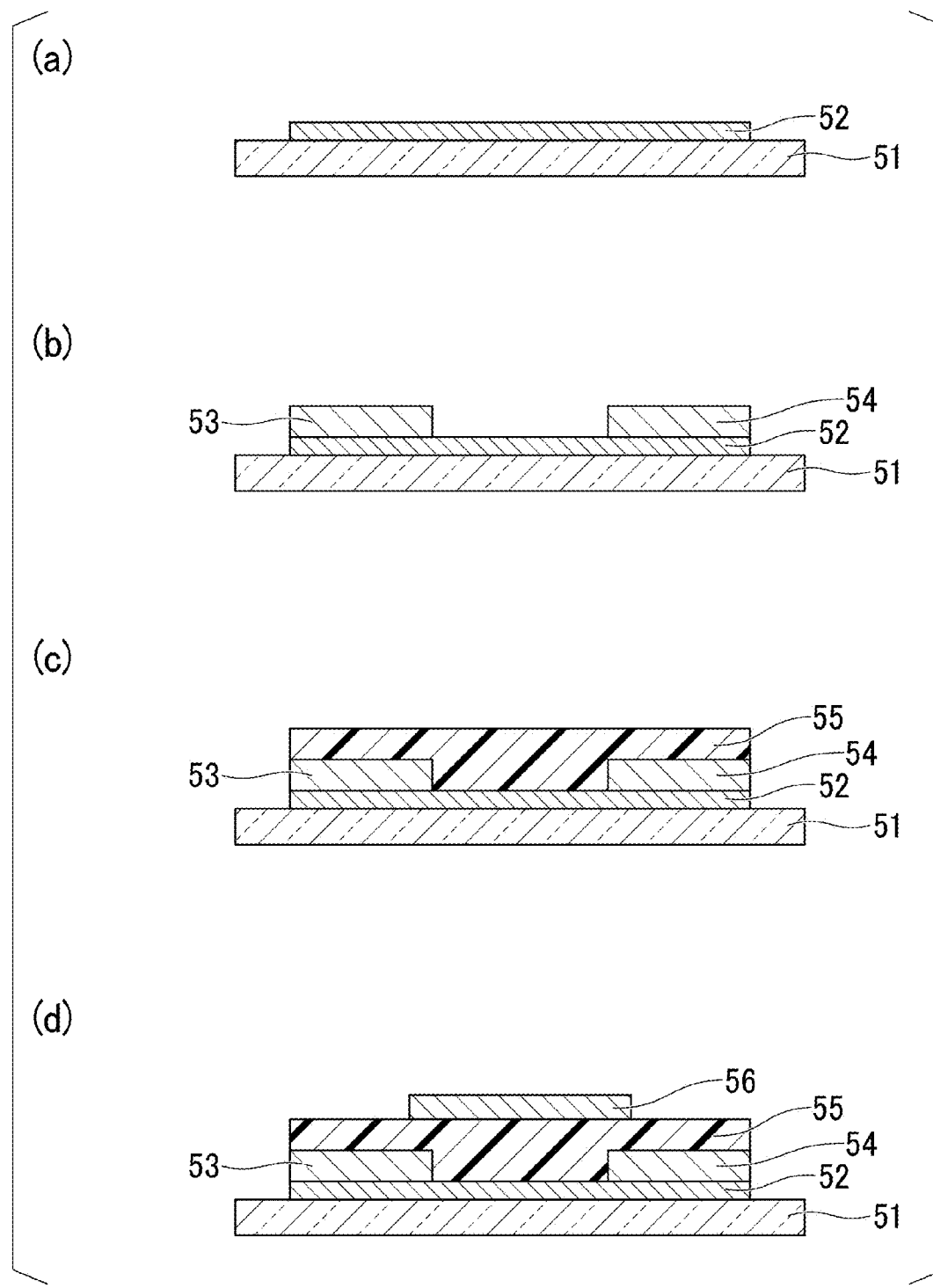
FIG. 4 is a process diagram showing another example of the method of manufacturing a thin film transistor.

FIG. 4 is a process diagram showing another example of the method of manufacturing a thin film transistor according to the present embodiment.

(11) First, as shown in FIG. 4 (a), an oxide semiconductor film 52 is formed on a substrate 51 made of resin, glass, or the like according to the method of transferring a thin film of the present embodiment described above.

(12) Next, as shown in FIG. 4 (b), with a known technique, a source electrode 53 and a drain electrode 54 are formed on the oxide semiconductor film 52.

(13) Next, as shown in FIG. 4 (c), with a known technique, a gate insulating film 55 is formed such that the source electrode 53 and the drain electrode 54 are covered.

(14) Next, as shown in FIG. 4 (d), with a known technique, a gate electrode 56 is formed on the gate insulating film 55, and it is possible to obtain a thin film transistor.

[Method of Forming a Pixel Electrode of a Liquid Crystal Display Device]

A method of forming a pixel electrode of a liquid crystal display device of the present embodiment is a method including a process of transferring a pixel electrode on a substrate on which a thin film transistor is formed according to the above-described method of transferring a thin film.

Figure 5:
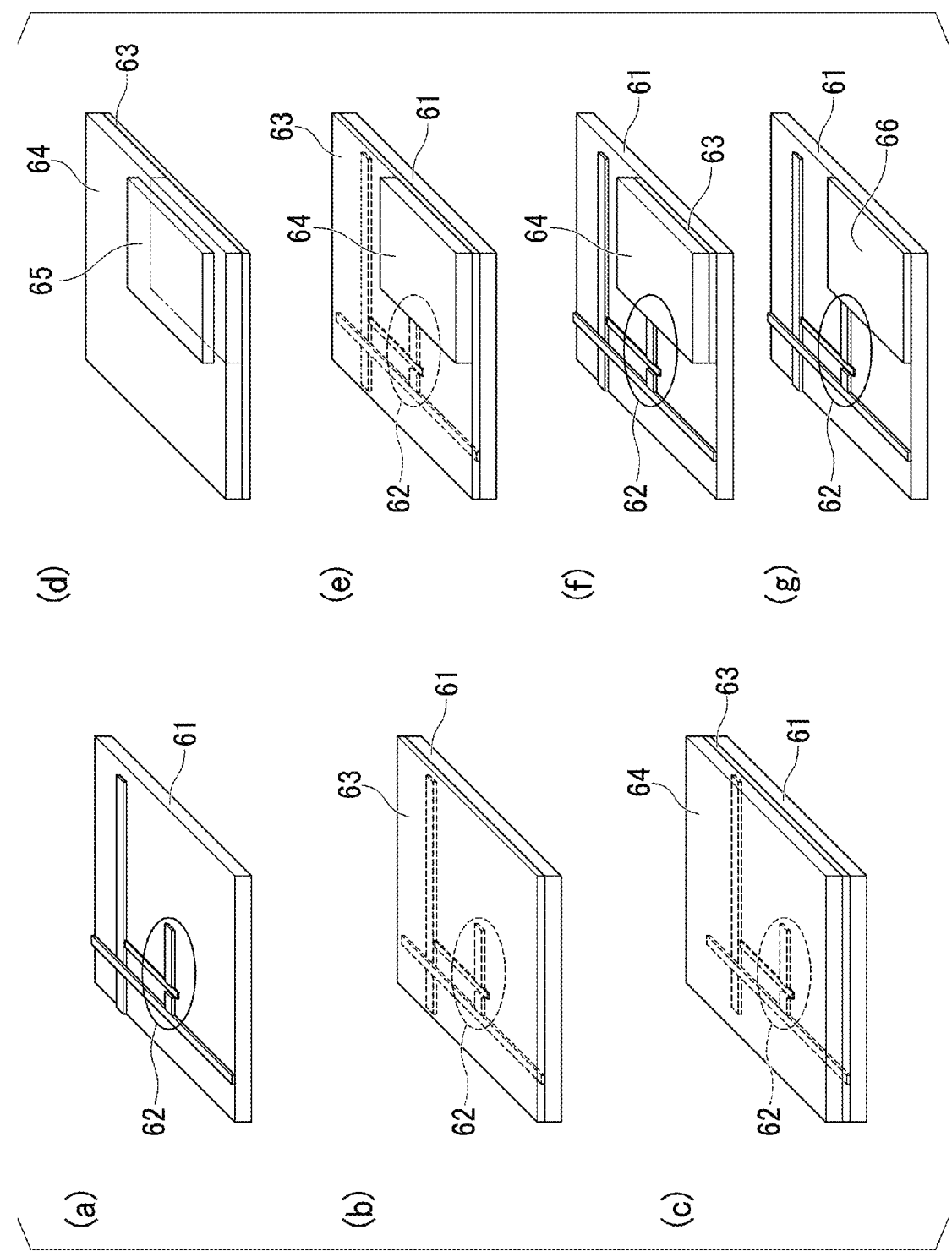
FIG. 5 is a process diagram showing an example of a method of forming a pixel electrode of a liquid crystal display device.

FIG. 5 is a process diagram showing an example of a method of forming a pixel electrode of a liquid crystal display device according to the present embodiment.

(21) First, as shown in FIG. 5 (a), with a known technique, a thin film transistor 62 configured by a gate electrode, a gate insulating film, and a semiconductor film and patterned in a desired pattern is formed on a substrate (hereinafter, referred to as a "second substrate") 61 configured by resin, glass, or the like.

(22) Next, as shown in FIG. 5 (b), an oxide semiconductor film 63 is transferred on the second substrate 61, on which the thin film transistor 62 is formed, according to the above-described method of transferring a thin film.

At this time, a substrate (hereinafter, referred to as a "first substrate"), on which the oxide semiconductor film 63 having a predetermined desired thickness is formed, is prepared. Note that, the thickness of the oxide semiconductor film 63 is not particularly limited; the thickness of the oxide semiconductor film 63 can be, for example, in a range of 100 nm to 1 μm. For example, the thickness of the oxide semiconductor film 63 can be about 100 nm, 200 nm, 300 nm, 400 nm, 500 nm, 600 nm, 700 nm, 800 nm, 900 nm, or 1000 nm.

Further, after liquid is applied to the oxide semiconductor film 63 formed on the first substrate or liquid is applied to the second substrate 61 on which the thin film transistor 62 is formed, a surface on which the oxide semiconductor film 63 is formed in the first substrate and a surface on which the thin film transistor 62 is formed in the second substrate 61 are made to come into contact with each other via liquid, and the first substrate and the second substrate 61 are heated.

(23) Next, as shown in FIG. 5 (c), a resist 64 to be patterned into a shape of a desired pixel electrode is applied on the oxide semiconductor film 63 transferred on the second substrate 61.

(24) Next, as shown in FIG. 5 (d), by exposing the resist 64 applied on the oxide semiconductor film 63 using a photomask 65, the resist 64 is patterned into the shape of the pixel electrode.

(25) Next, as shown in FIG. 5 (e), the resist 64 of the exposed portion is removed using a developer such as tetramethylammonium hydroxide (TMAH).

(26) Next, as shown in FIG. 5 (f), since chemical durability of the oxide semiconductor film 63 transferred on the second substrate 61 is completely the same as chemical durability of the oxide semiconductor film 63 before the oxide semiconductor film 63 is transferred, the oxide semiconductor film 63 is etched using a commonly-used etcher.

(27) Next, as shown in FIG. 5 (g), by removing the resist 64, a pixel electrode 66 can be obtained.

Alternatively, it is also possible to pattern in advance the oxide semiconductor film 63 before being transferred and directly transfer the patterned oxide semiconductor film 63. Such a process is available by aligning the pixel electrode 66 and the thin film transistor 62 with high accuracy. Thereby, in the process of transferring the oxide semiconductor film 63 and the subsequent processes, processes such as exposure or development used to pattern the oxide semiconductor film 63 become unnecessary.

On the other hand, it is also possible to pattern the pixel electrode 66 on the second substrate 61 in advance before the thin film transistor 62 is formed and then form the thin film transistor 62. In this case, the manufacturing process of the pixel electrode 66 may be performed in the order of (22), (23), (24), (25), (26), (27), and then (21) described above.

According to the method of forming a pixel electrode of a liquid crystal display device of the present embodiment, when the oxide semiconductor film 63 is transferred from the first substrate to the second substrate 61, a release film or an adhesive is not required, and therefore it is possible to directly form the oxide semiconductor film 63 on the second substrate 61 to be a ground. Further, since the thin film transistor 62 is insoluble in liquid required when the oxide semiconductor film 63 is peeled from the first substrate, the thin film transistor 62 is not degraded due to the liquid. Further, since the temperature when the oxide semiconductor film 63 is transferred is equal to or greater than a temperature at which the liquid evaporates (boiling point of liquid) and is less than a melting point of the first substrate and the second substrate 61, the second substrate 61 and the thin film transistor 62 are not degraded due to heat when the oxide semiconductor film 63 is transferred.

EXAMPLE

Hereinafter, Example of the method of transferring a thin film and the method of manufacturing a thin film transistor will be further specifically described; however, the present invention is not limited to the following Example.
(Method of Transferring a Thin Film)

First, an acrylic substrate (first substrate) was prepared, and directly on the acrylic substrate, using a sputtering method, an aluminum-doped zinc oxide (AZO) film made of zinc oxide doped with 3 atom % of aluminum was deposited. The thickness of the aluminum-doped zinc oxide film formed on the acrylic substrate was 180 nm, and the sheet resistance was 200 ohms per square.

Next, a PET substrate (second substrate) used for transferring an aluminum-doped zinc oxide film formed on an acrylic substrate was prepared.

Next, the PET substrate was immersed in ethanol, and ethanol was applied to a surface made to come into contact with the surface on which the oxide semiconductor film was formed in the acrylic substrate.

Next, the surface of the PET substrate on which ethanol was applied was made to come into contact with the surface on which the aluminum-doped zinc oxide film was formed in the acrylic substrate. Then, the PET substrate was heated at 100° C. for three minutes. Thereby, the aluminum-doped zinc oxide film was peeled from the acrylic substrate, ethanol was completely evaporated to dry the PET substrate, and the aluminum-doped zinc oxide film was attached to the surface of the PET substrate.

In this way, the aluminum-doped zinc oxide film formed on the acrylic substrate was transferred to the surface of the PET substrate.

The sheet resistance of the aluminum-doped zinc oxide film transferred to the surface of the PET substrate was 2000 ohms per square.

Figure 6:
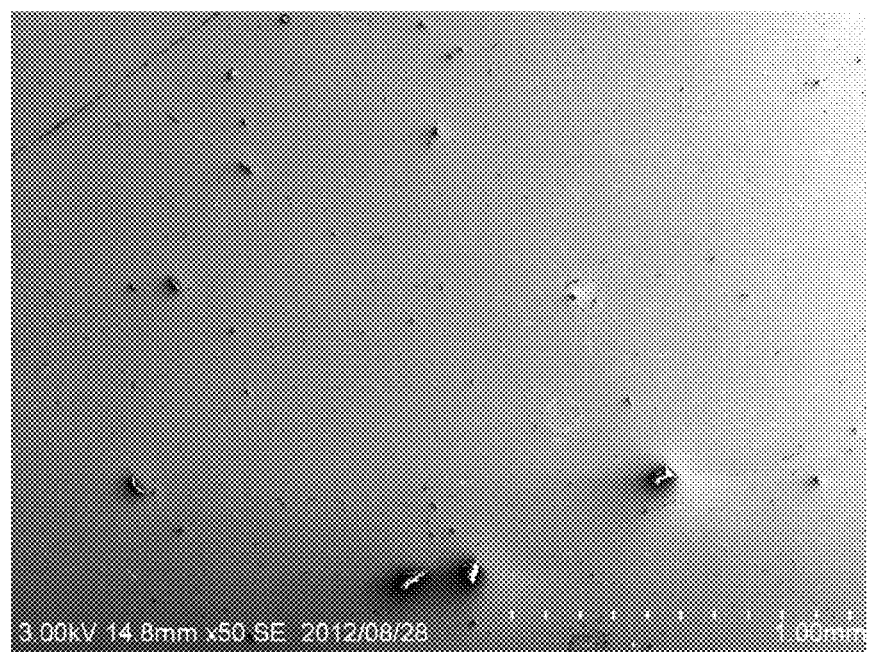
FIG. 6 is a SEM image of an aluminum-doped zinc oxide film transferred to one surface of a PET substrate in Example.

Further, the aluminum-doped zinc oxide film transferred to the surface of the PET substrate was observed using a scanning electron microscope (SEM). FIG. 6 is a SEM image of the aluminum-doped zinc oxide film transferred to the surface of the PET substrate. As shown in FIG. 6, it was found that the obtained aluminum-doped zinc oxide film was transferred on the PET substrate without cracks, particles, and impurities.

Figure 7:
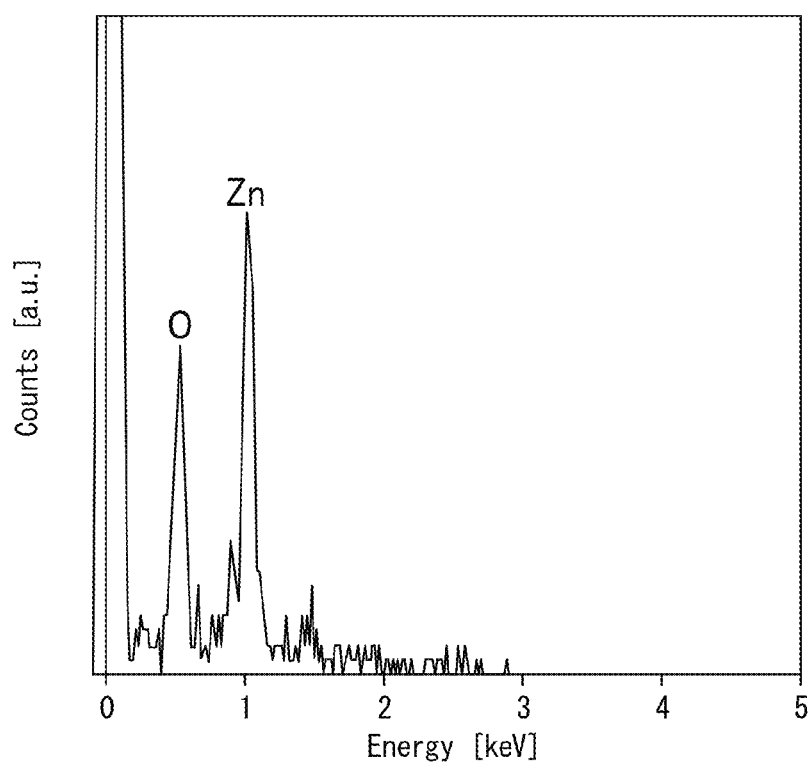
FIG. 7 is a diagram showing a measurement result of a composition analysis by EDX of the aluminum-doped zinc oxide film transferred to the surface of the PET substrate in Example.

Further, a composition analysis of the aluminum-doped zinc oxide film transferred to the surface of the PET substrate was performed using Energy Dispersive X-ray Spectrometry (EDX). As shown in FIG. 7, only oxygen and zinc were detected, and it was found that a zinc oxide film was obtained. Note that, the doping amount of aluminum to zinc oxide was smaller than the detection limit of EDX, and therefore aluminum was not detected.

Figure 8:
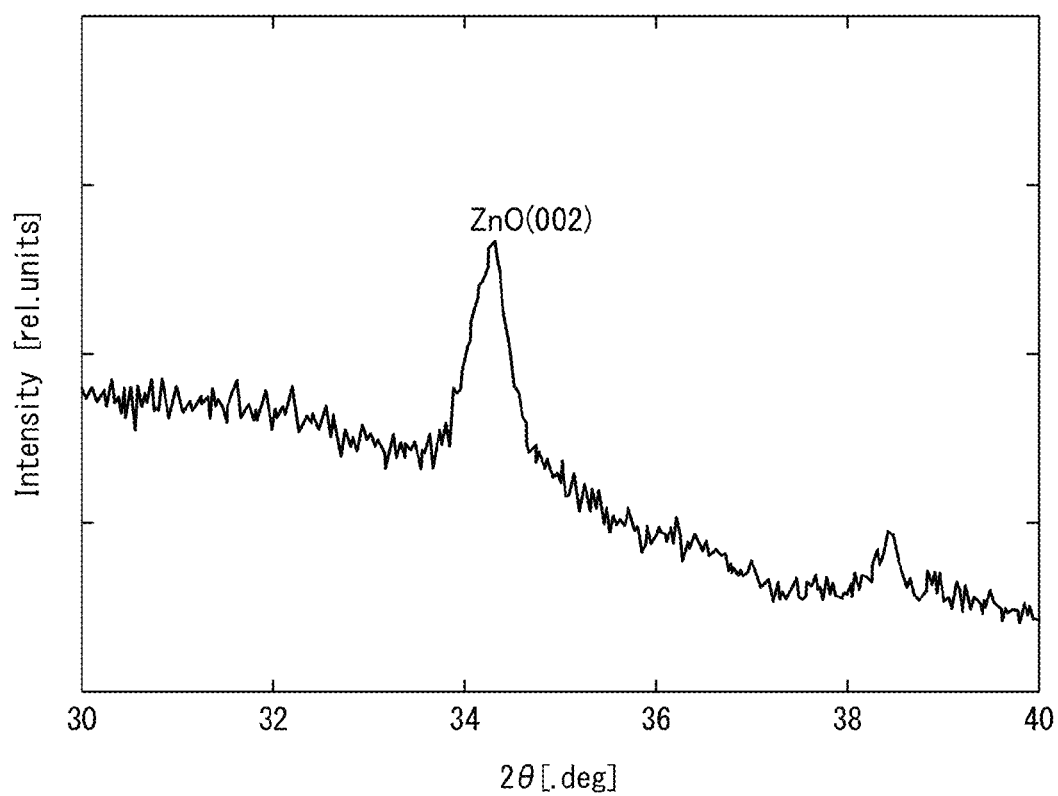
FIG. 8 is a diagram showing a measurement result of a crystalline structure analysis by XRD of the aluminum-doped zinc oxide film transferred to the surface of the PET substrate in Example.

Further, a crystal structure analysis of the aluminum-doped zinc oxide film transferred to the surface of the PET substrate was performed using X-ray Diffraction (XRD). FIG. 8 is a result of a θ-2θ scan using XRD. The horizontal axis of FIG. 8 indicates 2θ, and the vertical axis indicates intensity. As shown in FIG. 8, only a diffraction peak of zinc oxide (002) was confirmed, and it was found that the aluminum-doped zinc oxide film was strongly oriented in the C-axis direction. That is, in this way, since the aluminum-doped zinc oxide film is oriented in the C-axis direction with a high crystalline quality, it can be said that the aluminum-doped zinc oxide film transferred to the surface of the PET substrate exhibits a high conductivity.
(Method of Manufacturing a Thin Film Transistor)

A Si substrate on which a silicon oxide film (film thickness: 200 nm) was formed was prepared. Next, a source electrode and a drain electrode made of silver (Ag) were formed on the silicon oxide film using a sputtering method. At this time, the thickness of the source electrode and the drain electrode was 50 nm.

Then, an acrylic substrate on which a zinc oxide film (150 nm) was formed was prepared using a sputtering method, ethanol was applied by spin coating at 400 rpm for 3 seconds on the Si substrate on which the source electrode and the drain electrode were formed, and then the acrylic substrate and the Si substrate were made to come into contact with each other.

Then, the acrylic substrate was heated to 90° C., and 5 minutes later, the acrylic substrate and the Si substrate were peeled from each other. Thus, the zinc oxide film was transferred on the source electrode, the drain electrode, and a portion of the Si substrate between the source electrode and the drain electrode. Then, by using the Si substrate as the gate electrode, the characteristics of the fabricated thin film transistor were evaluated.

Figure 9:
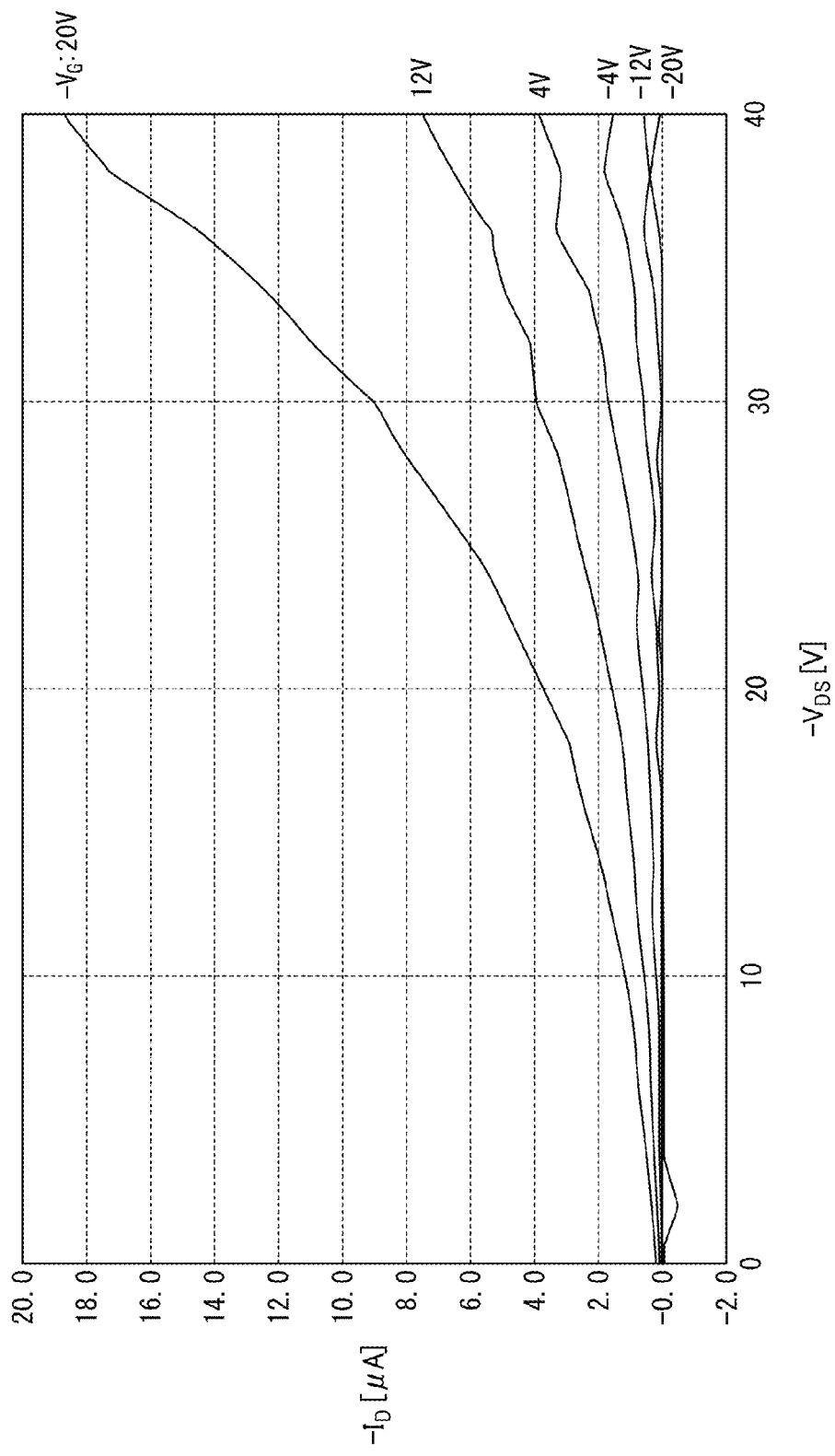
FIG. 9 is a graph showing characteristics of a thin film transistor fabricated in Example.

FIG. 9 is a graph showing the characteristics of the fabricated thin film transistor. In the graph of FIG. 9, the horizontal axis indicates a voltage applied between the source and the drain, and the vertical axis indicates a current valued detected at the drain electrode. One of the results shown in the drawing corresponds to each of the gate voltages applied to the gate electrode.

A gate voltage of −20 V to 20 V was applied to the gate electrode of the obtained thin film transistor, and a voltage of 0 to −40 V was applied between the source and the drain to flow a current.

As the result, as shown in FIG. 9, the fabricated thin film transistor was operated as a transistor. As described above, it was possible to transfer a thin film on an electrode and also a portion between electrodes without using a release layer or an adhesion layer, and it was also possible to confirm the operation of a thin film transistor having such a thin film as a semiconductor layer.

What is claimed is:

1. A method of transferring a thin film, in which a thin film formed on a first substrate is transferred to a second substrate, the method comprising:
    allowing the first substrate to come into contact with a liquid to swell the first substrate;
    allowing the second substrate and the thin film to come into contact with each other via the liquid; and
    drying the liquid to allow the thin film to adhere to the second substrate.

2. The method of transferring a thin film according to claim 1, wherein
    a wettability of the first substrate for the liquid is lower than a wettability of the second substrate for the liquid.

3. The method of transferring a thin film according to claim 1, wherein
    the liquid includes alcohol.

4. The method of transferring a thin film according to claim 1, wherein
    the first substrate is configured by an acrylic resin.

5. The method of transferring a thin film according to claim 1, wherein
    the second substrate is configured by a resin material.

6. The method of transferring a thin film according to claim 1, wherein
    the second substrate has flexibility.

7. The method of transferring a thin film according to claim 1, wherein
    the thin film is an oxide semiconductor.

8. The method of transferring a thin film according to claim 7, wherein
    the oxide semiconductor is zinc oxide.

9. The method of transferring a thin film according to claim 1, wherein
    the thin film formed on the first substrate is formed by a vacuum deposition method.

10. A method of manufacturing a thin film transistor, the method comprising:
    forming a semiconductor layer provided in contact with a source electrode and a drain electrode, wherein
    the semiconductor layer is formed by the method of transferring a thin film according to claim 1.

11. A method of forming a pixel electrode of a liquid crystal display device, the method comprising:
    forming a pixel electrode connected to a thin film transistor, wherein
    the pixel electrode is formed by the method of transferring a thin film according to claim 1.

* * * * *